United States Patent
Matsumiya (10) Patent No.: US 7,251,798 B2
(45) Date of Patent: Jul. 31, 2007

(54) METHOD AND APPARATUS FOR QUANTIFYING THE TIMING ERROR INDUCED BY CROSSTALK BETWEEN SIGNAL PATHS

(75) Inventor: Hiroshi Matsumiya, San Jose, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 238 days.

(21) Appl. No.: 11/066,587

(22) Filed: Feb. 25, 2005

(65) Prior Publication Data

US 2006/0195805 A1 Aug. 31, 2006

(51) Int. Cl.
- G06F 17/50 (2006.01)
- G06F 19/00 (2006.01)
- G01R 29/02 (2006.01)

(52) U.S. Cl. .................. 716/6; 716/4; 702/79
(58) Field of Classification Search ............. 716/4, 716/5, 6; 702/79
See application file for complete search history.

(56) References Cited

U.S. PATENT DOCUMENTS

| | | | | |
|---|---|---|---|---|
| 6,128,769 A * | 10/2000 | Carlson et al. | ............ | 716/6 |
| 6,499,131 B1 * | 12/2002 | Savithri et al. | ............ | 716/5 |
| 6,721,930 B2 * | 4/2004 | Sasaki et al. | ............ | 716/6 |
| 6,751,782 B2 * | 6/2004 | Levin et al. | ............ | 716/1 |
| 7,036,098 B2 * | 4/2006 | Eleyan et al. | ............ | 716/4 |
| 7,062,737 B2 * | 6/2006 | Tetelbaum et al. | ............ | 716/6 |
| 2001/0049812 A1 * | 12/2001 | Lutkemeyer | ............ | 716/6 |
| 2004/0098684 A1 * | 5/2004 | Amekawa | ............ | 716/6 |
| 2004/0205678 A1 * | 10/2004 | Tuncer et al. | ............ | 716/1 |
| 2006/0195806 A1 * | 8/2006 | Matsumiya | ............ | 716/6 |

* cited by examiner

Primary Examiner—Thuan V. Do
Assistant Examiner—Magid Y. Dimyan (57) ABSTRACT

In one embodiment, each of a plurality of stimulus signals is sequentially driven onto a number of stimulus signal paths. Each of the plurality of stimulus signals has a trigger edge. As each stimulus signal is driven onto the number of stimulus signal paths, a victim signal having a sensor edge is driven onto a victim signal path. After driving a corresponding stimulus and victim signal, the victim signal is sampled at or about a timing of the signal's sensor edge to thereby characterize the signal's sensor edge. The sensor edge characterizations corresponding to the different stimulus signals are then analyzed to quantify a timing error induced by crosstalk between the victim signal path and one or more of the stimulus signal paths.

20 Claims, 9 Drawing Sheets

METHOD AND APPARATUS FOR QUANTIFYING THE TIMING ERROR INDUCED BY CROSSTALK BETWEEN SIGNAL PATHS

SUMMARY OF THE INVENTION

In one embodiment, a method comprises sequentially driving each of a plurality of stimulus signals onto a number of stimulus signal paths. Each of the plurality of stimulus signals has a trigger edge. As each stimulus signal is driven onto the number of stimulus signal paths, a victim signal having a sensor edge is driven onto a victim signal path. After driving a corresponding stimulus and victim signal, the victim signal is sampled at or about a timing of the signal's sensor edge to thereby characterize the signal's sensor edge. The sensor edge characterizations corresponding to the different stimulus signals are then analyzed to quantify a timing error induced by crosstalk between the victim signal path and one or more of the stimulus signal paths.

Other embodiments are also disclosed.

BRIEF DESCRIPTION OF THE DRAWINGS

Illustrative embodiments of the invention are illustrated in the drawings, in which.

DETAILED DESCRIPTION OF AN EMBODIMENT

Figure 1:
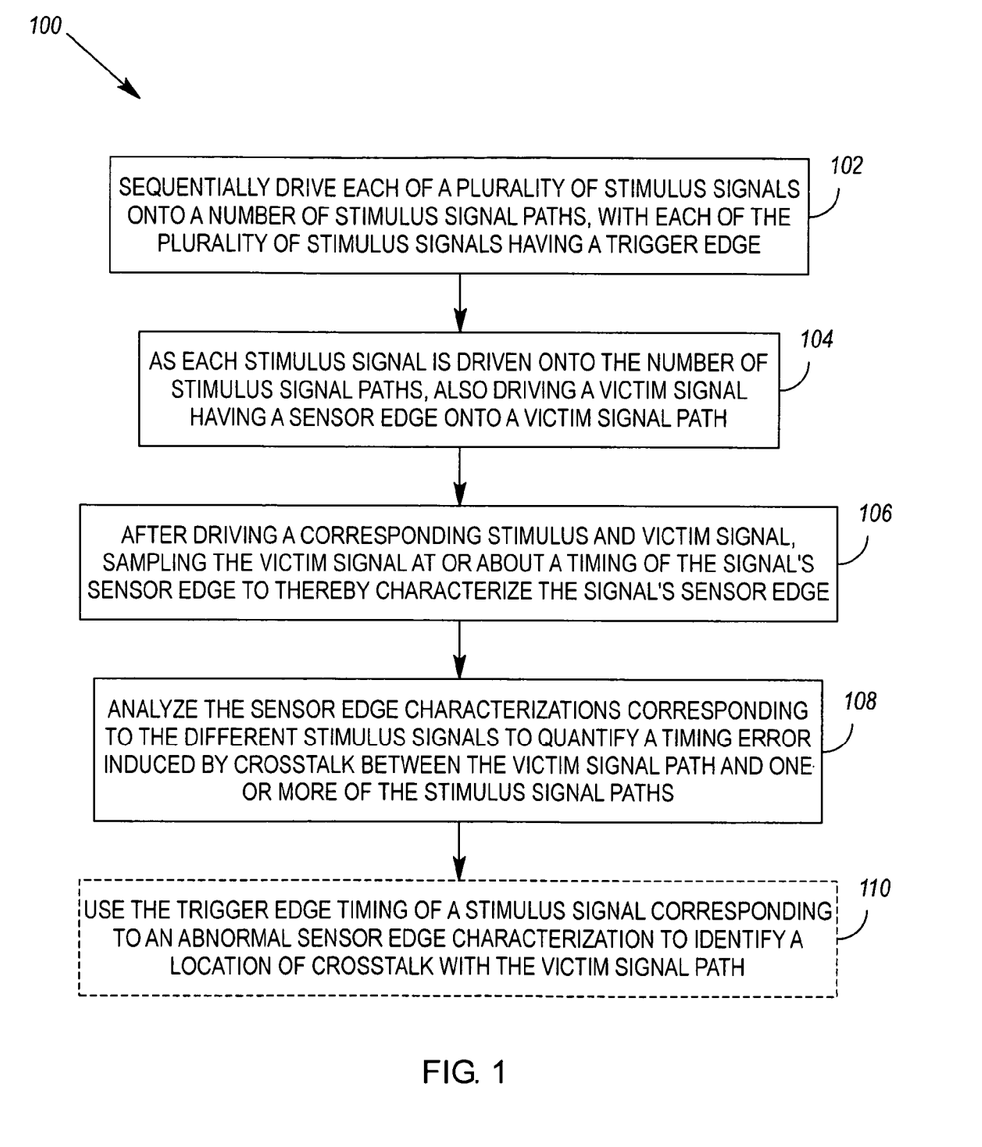
FIG. 1 illustrates a first exemplary method for quantifying the timing error induced by crosstalk between signal paths.
Figure 2:
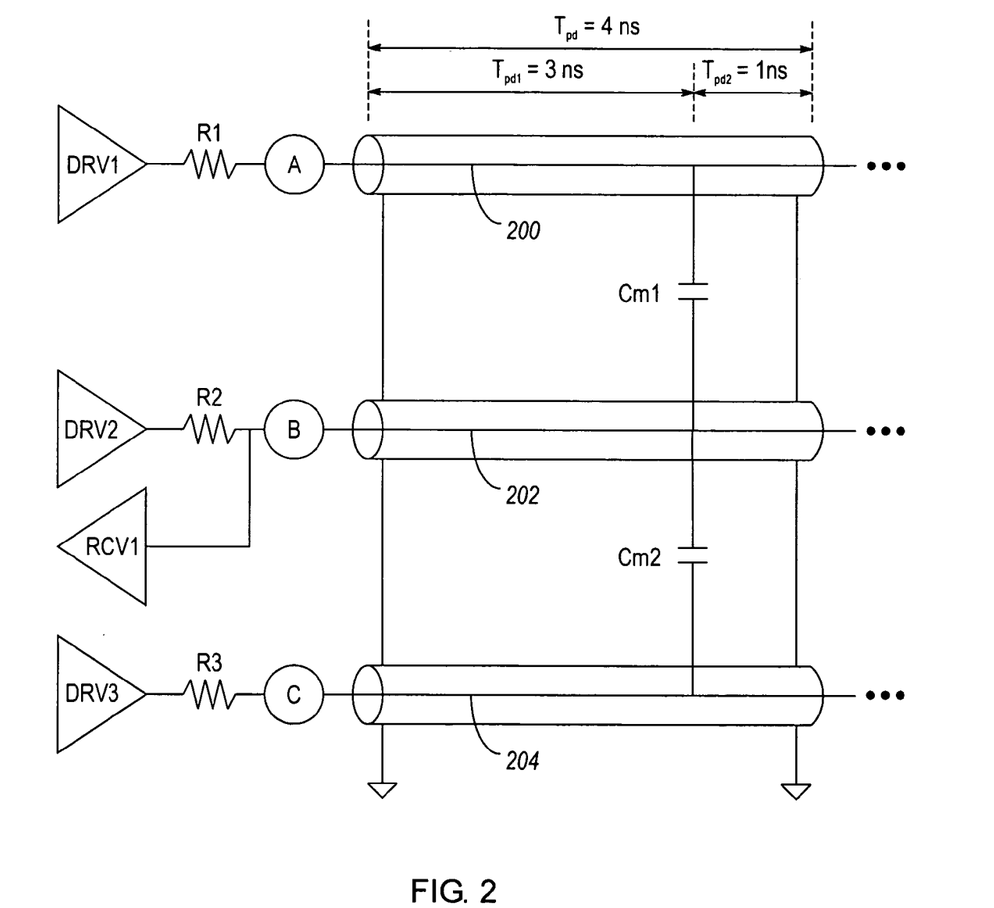
FIG. 2 illustrates exemplary crosstalk caused by mutual capacitance between signal paths.

FIG. 1 illustrates an exemplary method 100 for quantifying the timing error induced by crosstalk between signal paths. The method 100 comprises sequentially driving 102 each of a plurality of stimulus signals onto a number of stimulus signal paths. Each of the plurality of stimulus signals has a trigger edge. As each stimulus signal is driven onto the number of stimulus signal paths, a victim signal having a sensor edge is driven 104 onto a victim signal path. After driving a corresponding stimulus and victim signal, the victim signal is sampled 106 by the receiver RCV1, at or about a timing of the signal's sensor edge, to thereby characterize the signal's sensor edge. The sensor edge characterizations corresponding to the different stimulus signals are then analyzed 108 to quantify a timing error induced by crosstalk between the victim signal path and one or more of the stimulus signal paths. FIG. 2 illustrates a plurality of signal paths 200, 202, 204 to which the method 100 may be applied. Each of the signal paths 200, 202, 204 is similarly configured and, by way of example, each path 200, 202, 204 is shown to be a transmission line that is driven at one end by a driver having an associated impedance (i.e., DRV1/R1, DRV2/R2, or DRV3/R3). The other ends of the signal paths 200, 202, 204 are left "open" (e.g., not terminated, or terminated to ground with a high value impedance). Alternately, the "other ends" may be terminated in other ways (e.g., with an impedance matched to the path's driver impedance, or with a short to ground). One end of the signal path 202 is coupled to a receiver (RCV1). Although not shown, other ones of the signal paths 200, 204 could also be coupled to receivers. The capacitances Cm1 and Cm2 reflect "mutual capacitance" between the signal paths 200, 202, 204. When signals are propagated over the signal paths 200, 202, 204, these mutual capacitances (Cm1 and Cm2) can result in crosstalk-reflected voltages (e.g., crosstalk XTALK1 resulting from capacitance Cm1, and crosstalk XTALK2 resulting from capacitance Cm2).

The signal paths 200, 202, 204 may represent, for example, different channels of automated test equipment (ATE). As a result, each signal path 200, 202, 204 may comprise various traces, cables, and connectors of an instrument, load board, probe card, cables, et cetera.

The length of each signal path 200, 202, 204 may be characterized by the receiver RCV1 in terms of the time it takes a signal to propagate the length of the signal path. By way of example, each signal path 200, 202, 204 is shown to have a length, $T_{pd}$, of 4 nanoseconds (ns), with exemplary crosstalk XTALK1, XTALK2 between the signal paths 200, 202, 204 occurring at propagation distances of 3 nanoseconds (ns) from the driven ends of the signal paths 200, 202, 204. For simplicity, each signal path 200, 202, 204 is shown to have crosstalk with only one other signal path, and at only one location. However, signal paths could alternately be influenced by more or fewer instances of crosstalk, and crosstalk could also take other forms (such as inductive or mixed forms).

Figure 3:
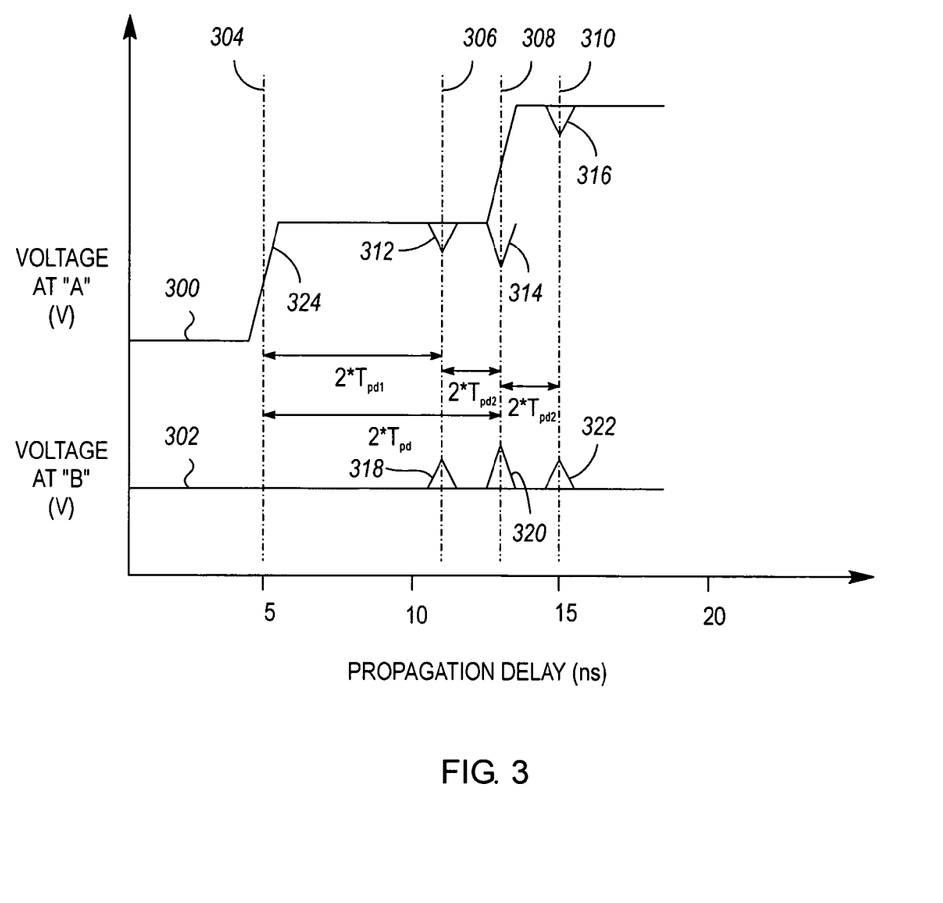
FIG. 3 illustrates exemplary signal reflections and crosstalk induced by driving a stimulus signal onto one of the signal paths shown in FIG. 2.

FIG. 3 illustrates exemplary signal reflections 312, 314, 316 and crosstalk 318, 320, 322 that may be induced by driving a stimulus signal 300 onto the signal path 200. That is, when a trigger edge 324 of a signal 300 is driven onto the signal path 200, a portion of the trigger edge 324 is reflected upon reaching crosstalk XTALK1. The reflected portion 312 of the trigger edge 324 then arrives at observation point A (see FIG. 2) at time 306 (i.e., at time $2*T_{pd1}$ from the launch of the trigger edge 324). Similarly, and as a result of the crosstalk XTALK1, a crosstalk reflection 318 arrives at observation point B at time 306. As reflections between the open end of the path 200 and the crosstalk XTALK1 continue to occur, additional signal reflections 314, 316 and crosstalk reflections 320, 322 may respectively arrive at observation points A and B (and at times 308 and 310).

In applying the method 100 to the signal paths 200, 202, 204 shown in FIG. 2, the stimulus signals 300 (FIG. 4) and 300a (FIG. 5) may be sequentially driven onto one or both of the signal paths 200, 204. For example, in one embodiment, the signal 300 is driven onto the paths 200, 204 at the same time, and then the signal 300a is driven onto the paths 200, 204 at the same time.

Figure 4:
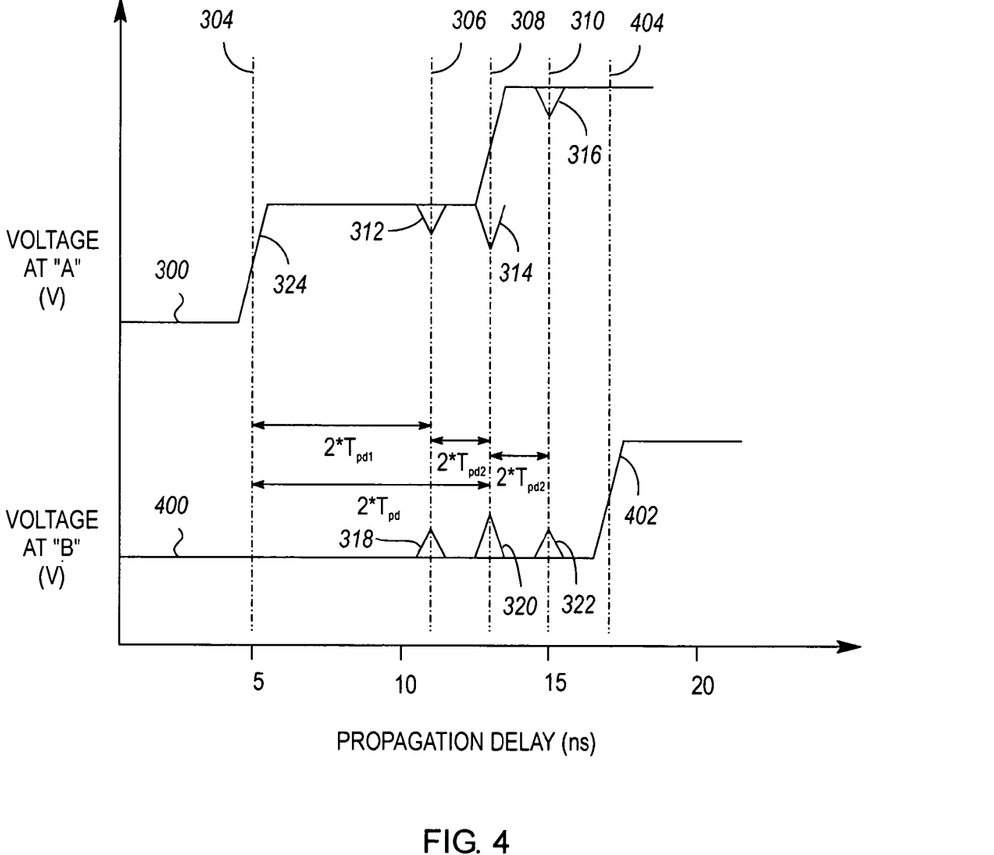
FIGS. 4 & 5 illustrate the driving of different stimulus signals onto one of the signal paths shown in FIG. 2, and their various effects on a victim signal that is driven onto another of the signal paths shown in FIG. 2.
Figure 5:
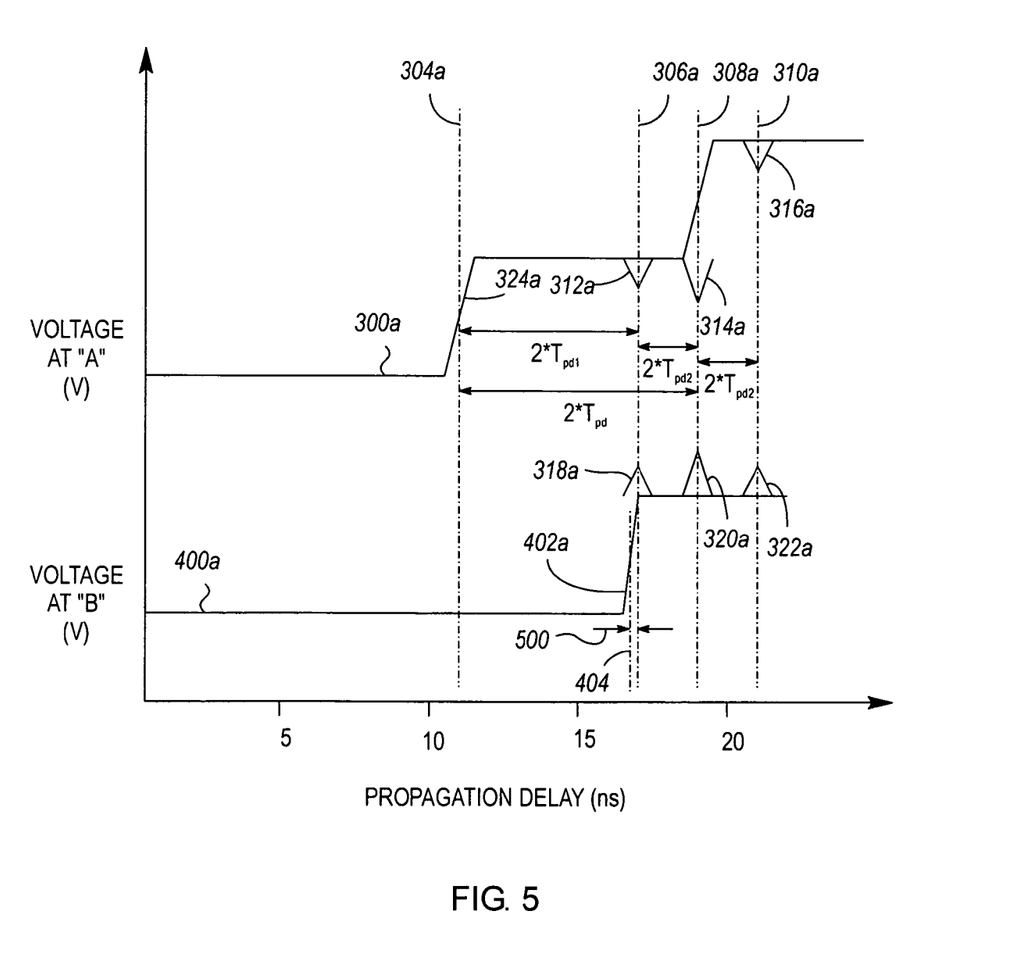

As shown in FIGS. 4 & 5, the trigger edges 324, 324a of the stimulus signals 300, 300a have different timings 304, 304a. As each of these stimulus signals 300, 300a is driven onto one or more stimulus signal paths (e.g., path 200), a corresponding victim signal 400, 400a having a sensor edge 402, 402a is driven onto a victim signal path (e.g., path 202). With respect to the stimulus signal 300, and the timing 304 of its trigger edge 324, one can see that the reflections 312, 314, 316, 318, 320, 322 induced by the trigger edge 324 as a result of crosstalk with the victim signal path 202 arrive at observation points A and B before the timing 404 of the sensor edge 402. However, with respect to the stimulus signal 300a, and the timing 304a of its trigger edge 324a, one sees that one of the reflections induced by the trigger edge 324a (i.e., reflection 320a) arrives at observation point B in sync with the timing 306a of sensor edge 402a, thereby modifying the timing 306a of the sensor edge 402a as compared to the timing 404 of the sensor edge 402 (see, e.g., the difference 500 in sensor edge midpoint timings 402a, 306a). Thus, both the midpoint and slope of the sensor edge 402a will differ from those of the sensor edge 402, even though both sensor edges 402, 402a are generated by the driver DRV2 in the same manner. As one can appreciate from the examples shown in FIGS. 4 & 5, by sequentially driving additional stimulus signals onto the stimulus signal path 200, each having a differently timed trigger edge, other ones of the reflections 318a, 322a resulting from the crosstalk XTALK1 can be made to overlap and modify the sensor edges of corresponding victim signals.

Figure 6:
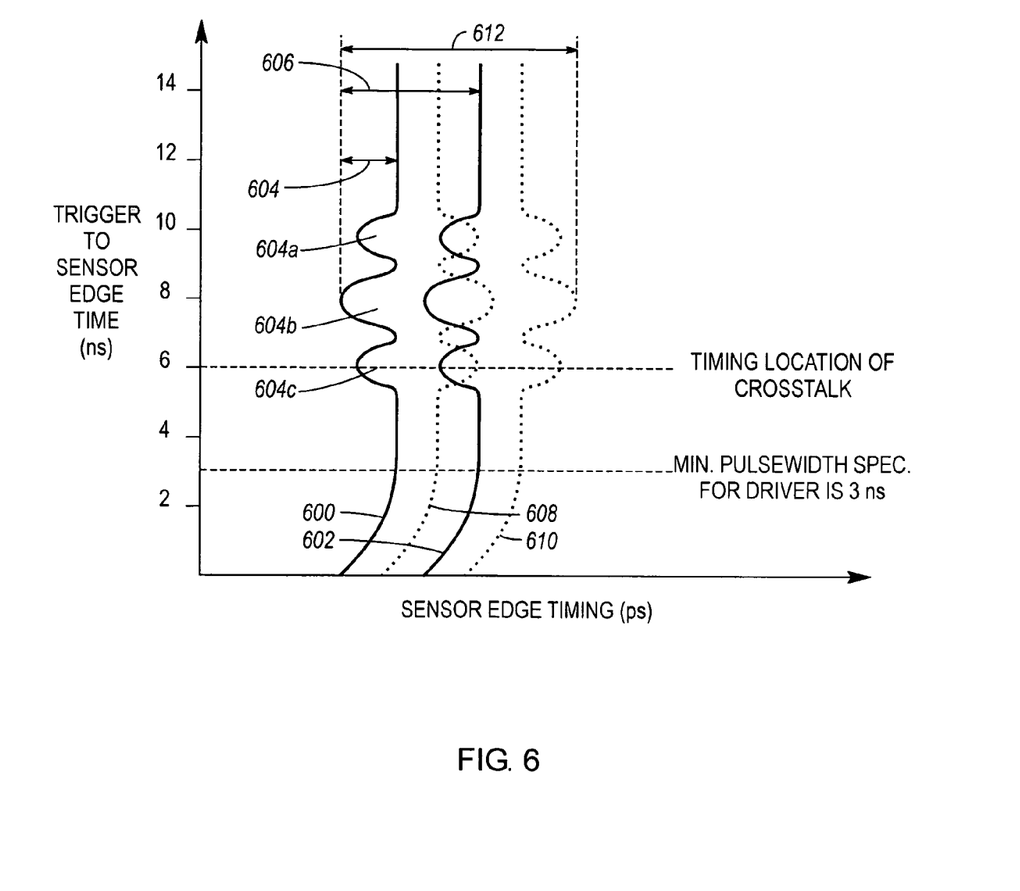
FIG. 6 illustrates an exemplary graphical representation of measured sensor edge data.

The sensor edges 402, 402a of victim signals 400, 400a corresponding to stimulus signals 300, 300a with differently timed trigger edges 324, 324a may be 1) characterized (e.g., by means of sensor edge midpoint timings obtained by sampling the victim signals 400, 400a using receiver RCV1) and then 2) plotted as shown in FIG. 6. By way of example, the plot 600 plots the midpoints of the sensor edges observed at point B. The horizontal units of the plot 600 represent the timings of the sensor edge midpoints in picoseconds (ps). The vertical units of the plot 600 represent the offsets between trigger and sensor edges of corresponding stimulus and victim signals. The variations (or abnormalities) 604a, 604b, 604c in sensor edge timing are indicative of the timing error induced by crosstalk between signal paths 200, 202. The magnitude 604 of the variations 604a, 604b, 604c represents the magnitude of the timing error induced by crosstalk between the signal paths 200, 202. The trigger-to-sensor edge offsets (i.e., 6 ns, 8 ns, 10 ns) corresponding to the variations 604a, 604b, 604c can be used 110 (FIG. 1) to identify where on the signal path 202 the crosstalk XTALK1 exists. That is, since the trigger edge of a stimulus signal has to travel from point A to the point of the crosstalk, and then an induced reflection needs to travel from the point of the crosstalk to observation point B, it can be determined that the crosstalk between signal paths 200 and 202 occurs at a propagation distance of 3 ns from point B (i.e., 6 ns÷2=3 ns).

As previously mentioned, a signal's sensor edge may be characterized by the receiver RCV1 in terms of the midpoint of the sensor edge. The midpoint of a signal's sensor edge may be found by, for example, sampling the signal (e.g., sampling its voltage) at a plurality of points extending from before its sensor edge to at least the midpoint of its sensor edge. The midpoint of a signal's sensor edge may also be found by sampling the signal at a plurality of points extending from after its sensor edge to at least the midpoint of its sensor edge. In some cases, it may be desirable to determine the midpoint of a signal's sensor edge in both of these ways—that is, by sampling it from the left and from the right. In accord with the method 100 (FIG. 1), all of the above sampling methods are considered different ways to sample a signal "at or about" the timing of a signal's sensor edge. In FIG. 6, the plot 600 represents early timings of sensor edges (i.e., based on their sampling from the left), and the plot 602 represents late timings of sensor edges (i.e., based on their sampling from the right). The variation or comparison 606 between early and late timings represents a peak-to-peak timing error associated with signal path crosstalk.

Figure 7:
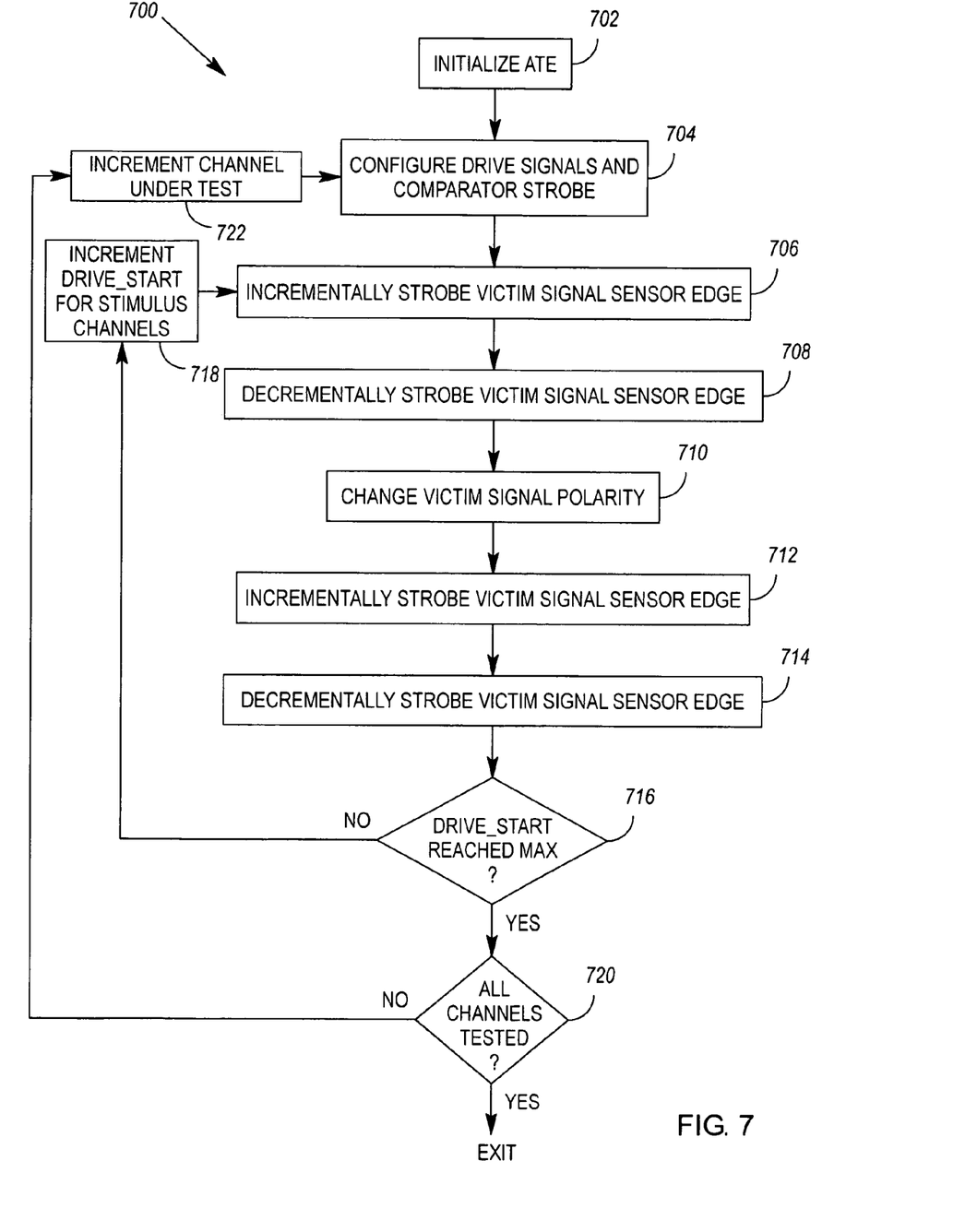
FIG. 7 illustrates a second exemplary method for quantifying the timing error induced by crosstalk between signal paths.

FIG. 7 illustrates how the method 100 may be applied to Agilent Technology, Inc.'s Versatest Series Model V4xxx ATE. However, it is noted that the method 100 is applicable to a wide variety of test and measurement equipment. Agilent Technologies, Inc. is a Delaware corporation having its principal place of business in Palo Alto, Calif., USA.

One of skill will recognize that, by choosing appropriate ranges of trigger and sensor edge timings, any portion of the ATE's signal paths may be evaluated for crosstalk problems, including signal path portions of the ATE's loadboards, probecards, calibration boards, interface boards, cables and sockets. Also, the method 100 may be applied to each of the ATE's channels, each of which is likely to already be associated with a signal driver and a signal receiver. In some embodiments, the method 100 may be applied to environments where ATE, a loadboard and a probecard each comprise thousands of traces. In such embodiments, the method 100 may be used to identify the most significant crosstalk between the many thousands of traces, in significantly less time than can conventional methods.

Figure 8:
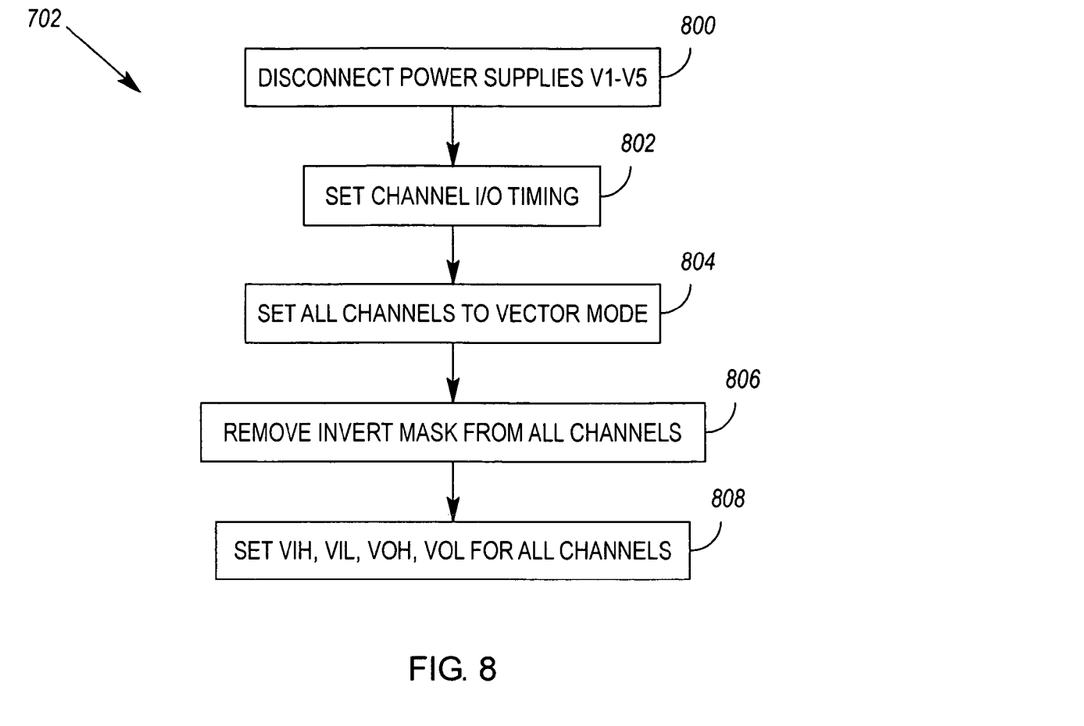
FIG. 8 illustrates an exemplary method for initializing ATE in accordance with the method shown in FIG. 7.

Proceeding now with a description of the method 700 (FIG. 7), the method begins with initialization 702 of the ATE. FIG. 8 illustrates exemplary steps that may be taken to initialize Versatest Series Model V4xxx ATE. That is, power supplies V1-V5 are disconnected 800; channel I/O (input/output) timing for stimulus and victim channels is set 802; the channels are set 804 to vector mode; the invert mask is removed 806 from all channels; and high and low input voltages (VIH, VIL, VOH, VOL) are set 808 for the channels.

Figure 9:
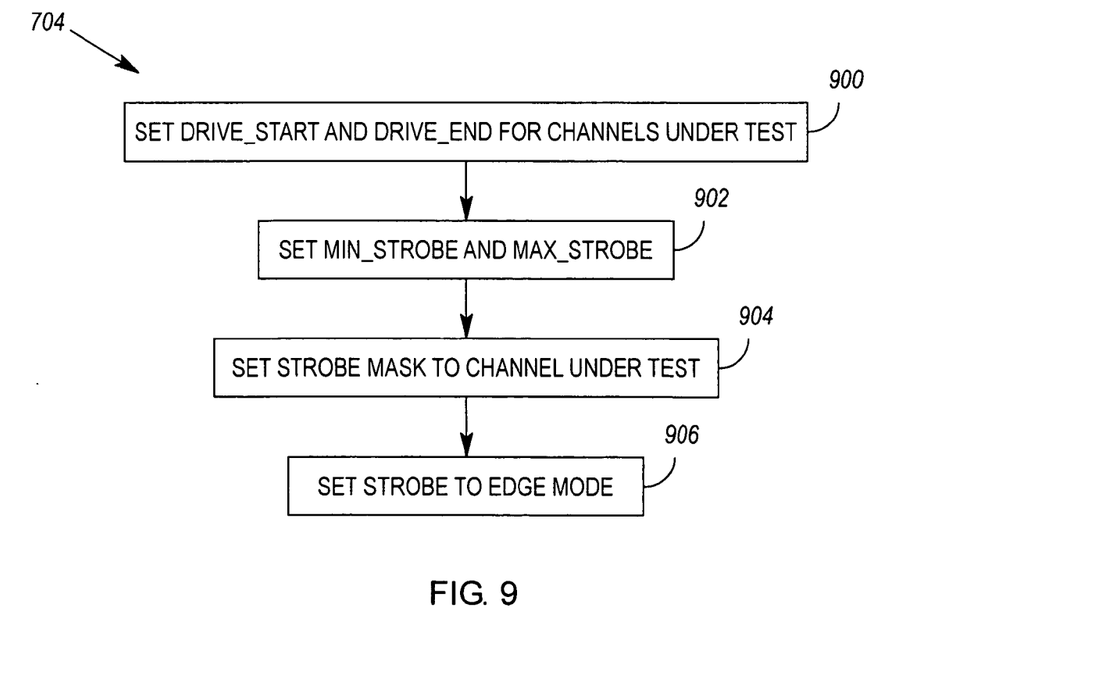
FIG. 9 illustrates an exemplary method for configuring the ATE in accordance with the method shown in FIG. 7.

Referring back to FIG. 7, the method 700 continues with drive signal (i.e., stimulus and victim signal) and receiver strobe configuration 704. FIG. 9 illustrates exemplary steps that may be taken to do this, including setting 902 the timing of a DRIVE_START and DRIVE_END for each signal to be driven onto a channel, including the timing of signal trigger and sensor edges; setting 904 a strobe start (i.e., MIN_STROBE) and strobe end (MAX_STROBE) of a strobe used to sample the sensor edge of a victim signal; setting 906 a strobe mask to the channel under test (i.e., the victim channel); and setting 908 the strobe receiver to edge mode. To limit potential crosstalk (and other potential interference) to selected channels, signal transmission on all of the channels but for the selected channels can be masked.

Referring back to FIG. 7 again, the method 700 continues with the incremental strobing 706 of a rising sensor edge of a victim signal driven onto a victim channel. That is, the victim signal is sampled by the receiver RCV1 in response to the strobe to characterize the signal's sensor edge from the left. The rising sensor edge is then decrementally strobed 708 to characterize the sensor edge from the right. Thereafter, the polarity of the victim signal may be changed 710, and the falling sensor edge of the new victim signal may then be incrementally and decrementally strobed 712, 714. Although not shown, it will often be useful to repeat the actions 706-714 for both polarities of a particular stimulus signal (i.e., for stimulus signals having the same trigger edge timing, but trigger edges of opposite polarity).

After characterizing the rising and falling sensor edges of the two polarities of a victim signal, it is determined whether a minimum or maximum trigger edge timing has been reached 716. If not, the timing of the stimulus signal's DRIVE_START is incremented 718, and the steps 706-714 are repeated. If so, it is determined whether all channels of the ATE have been tested 720 (i.e., whether all channels have had a chance to be the victim channel). If not, the channel under test is incremented 722 and steps 704-718 are repeated. Otherwise, the method 700 comes to an end.

Figure 10:
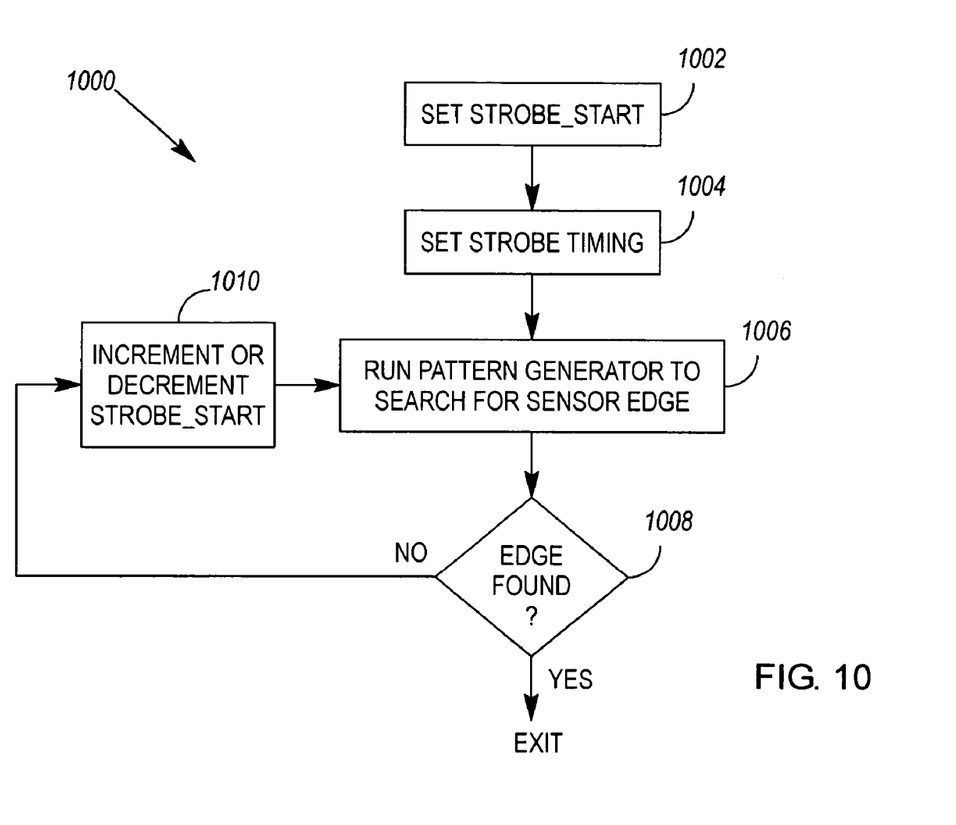
FIG. 10 illustrates an exemplary method for strobing a sensor edge of a victim signal, in accordance with the method shown in FIG. 7.

FIG. 10 illustrates an exemplary method 1000 for incrementally or decrementally strobing a sensor edge in accord with any of steps 706, 708, 712, 714 of the method 700. The method 1000 comprises setting 1002 a STROBE_START; setting 1004 the strobe timing; and running 1006 a pattern generator and searching for the midpoint of a sensor edge. If the midpoint is found 1008, the method 1000 completes. Otherwise, the STROBE_START is incremented or decremented 1010, and the pattern generator is used to search once again for the sensor edge. The threshold of the pattern generator is set to the voltage which is expected at the midpoint of a sensor edge.

When executing the method 700, the timing of DRIVE_START may be incremented over a time period equal to the propagation delay of channels under test, or over a range of trigger edge timings corresponding to a portion of a channel where crosstalk is expected to exist, thereby yielding a plurality of stimulus signals that are appropriate for testing a channel of channel portion of a given length and location. Also, STROBE_START may be incremented over a victim signal's entire period, or over a range where a victim signal's sensor edge is expected to be detected.

The data produced by crosstalk timing analyses may take many forms, including tables, databases, and illustrations. In some embodiments such data may be intermediate data to be utilized for further manual or automated analyses. The accuracy of the methods 100 and 700 may be improved by repeatability. For example, one may wish to loop a test vector 1000 times per channel, for example, to obtain a large enough set of data to produce a desired level of accuracy.

FIG. 6 illustrates an exemplary graphical representation (i.e. plot) of sensor edge midpoints relative to the method 700 and the signal paths 200, 202, 204 shown in FIG. 2. The vertical unit of the plot is the timing of the stimulus signal's trigger edge with respect to the victim signal's sensor edge, in nanoseconds. The horizontal unit of the plot is the detected sensor edge timing in picoseconds. Line 600 represents a plot of the rising sensor edge detected by incremental strobing. Line 602 represents a plot of the rising sensor edge detected by decremental strobing. Line 608 represents a plot of the falling sensor edge detected by incremental strobing. Line 610 represents a plot of the falling sensor edge detected by decremental strobing.

Below a pulsewidth of about 3 ns, the sensor edge plots have distortions that reflect the minimum pulsewidth for which the receiver (RCV1) connected to the signal path 202 can accurately detect a sensor edge midpoint. Note, however, that this 3 ns minimum pulsewidth is exemplary only. Depending on the ATE system of which the receiver forms a part, this minimum pulsewidth may be less or greater.

FIG. 6 illustrates some, but not all, of the useful measurements that may be derived from the collected data. For example, in addition to measurements 604 and 606, which have already been discussed, the measurements comprise a peak-to-peak timing error 612 for the crosstalk XTALK1, in addition to deadband. The peak-to-peak timing error 612 comprises the combined errors associated with jitter, linearity, receiver and driver errors, plus the maximum timing error caused by rising or falling edges being reflected by the crosstalk XTALK1.

Exemplary applications of the methods 100, 700 have been described above in the context of driving a plurality of stimulus signals, each having a different trigger edge timing, while repeatedly driving the same victim signal. Alternately, the plurality of stimulus signals could all have the same trigger edge timing, and the timing of the victim signal's sensor edge could be varied. Or, both trigger and sensor edge timings could be varied.

The methods described herein may be executed manually or automatically, either in full or in part. In some cases, the methods may be embodied in sequences of instructions that, when executed by a machine (e.g., ATE), cause the machine to perform the actions of the method. The sequences of instructions can be stored on a program storage device such as a fixed disk, removable disk, memory, or combination thereof, whether in a single location, or distributed across a network.

What is claimed is:

1. A method, comprising:
   sequentially driving each of a plurality of stimulus signals onto a number of stimulus signal paths, wherein each of the plurality of stimulus signals has a trigger edge;
   as each stimulus signal is driven onto the number of stimulus signal paths, also driving a victim signal having a sensor edge onto a victim signal path;
   after driving a corresponding stimulus and victim signal, sampling the victim signal at or about a timing of the signal's sensor edge to thereby characterize the signal's sensor edge; and
   analyzing the sensor edge characterizations corresponding to the different stimulus signals to quantify a timing error induced by crosstalk between the victim signal path and one or more of the stimulus signal paths.

2. The method of claim 1, wherein the signal samples comprise voltages.

3. The method of claim 1, wherein each victim signal is sampled at a plurality of points extending from before the signal's sensor edge to at least the midpoint of the signal's sensor edge.

4. The method of claim 3, wherein each victim signal's sensor edge is characterized by using the plurality of sample points for the signal to determine a timing of a midpoint of the signal's sensor edge.

5. The method of claim 3, wherein each victim signal is further sampled at a plurality of points extending from after the signal's sensor edge to at least the midpoint of the signal's sensor edge.

6. The method of claim 5, wherein each victim signal's sensor edge is characterized by,
   using the plurality of sample points beginning from before the signal's sensor edge to determine an early timing of a midpoint of the signal's sensor edge; and
   using the plurality of sample points beginning from after the signal's sensor edge to determine a late timing of a midpoint of the signal's sensor edge.

7. The method of claim 6, wherein analyzing the sensor edge characterizations corresponding to the different stimulus signals to quantify the timing error induced by crosstalk between the victim signal path and one or more of the stimulus signal paths comprises:
   comparing plots of early and late timings of the midpoints of the victim signals' sensor edges to quantify a peakto-peak timing error associated with crosstalk between the victim signal path and the one or more stimulus signal paths.

8. The method of claim 1, wherein each victim signal is sampled at a plurality of points extending from after the signal's sensor edge to at least the midpoint of the signal's sensor edge.

9. The method of claim 8, wherein each victim signal's sensor edge is characterized by using the plurality of sample points for the signal to determine a timing of a midpoint of the signal's sensor edge.

10. The method of claim 1, further comprising, using a difference in trigger edge and sensor edge timings of stimulus and victim signals corresponding to an abnormal sensor edge characterization to identify a location of crosstalk between the victim signal path and one or more of the stimulus signal paths.

11. The method of claim 1, wherein sets of corresponding drive signals comprise:
   a stimulus signal with a rising trigger edge and a victim signal with a rising sensor edge;
   a stimulus signal with a rising trigger edge and a victim signal with a falling sensor edge;
   a stimulus signal with a falling trigger edge and a victim signal with a rising sensor edge; and
   a stimulus signal with a falling trigger edge and a victim signal with a falling sensor edge.

12. The method of claim 1, wherein the signal paths are signal paths of a circuit tester.

13. The method of claim 12, further comprising, repeating said driving, sampling and analyzing actions for each channel of the circuit tester, each time setting a different channel of the circuit tester as the victim signal path.

14. The method of claim 1, wherein at least some of the stimulus signals have different trigger edge timings.

15. The method of claim 14, wherein the victim signals have the same sensor edge timings.

16. The method of claim 1, wherein the stimulus signals have the same trigger edge timings.

17. The method of claim 1, wherein at least some of the victim signals have different sensor edge timings.

18. The method of claim 17, wherein the stimulus signals have the same trigger edge timings.

19. A program storage device having stored thereon sequences of instructions that, when executed by a machine, cause the machine to perform the actions of:
   sequentially driving each of a plurality of stimulus signals onto a number of stimulus signal paths, wherein each of the plurality of stimulus signals has a trigger edge;
   as each stimulus signal is driven onto the number of stimulus signal paths, also driving a victim signal having a sensor edge onto a victim signal path;
   after driving a corresponding stimulus and victim signal, sampling the victim signal at or about a timing of the signal's sensor edge to thereby characterize the signal's sensor edge; and
   analyzing the sensor edge characterizations corresponding to the different stimulus signals to quantify a timing error induced by crosstalk between the victim signal path and one or more of the stimulus signal paths.

20. The program storage device of claim 14, wherein each victim signal is sampled at a plurality of points on either side of its sensor edge.

* * * * *